United States Patent
Yu et al.

(10) Patent No.: US 10,649,336 B2
(45) Date of Patent: May 12, 2020

(54) METHOD AND SYSTEM FOR FABRICATING SEMICONDUCTOR DEVICE

(71) Applicant: TAIWAN SEMICONDUCTOR MANUFACTURING CO., LTD., Hsinchu (TW)

(72) Inventors: Jun-Yih Yu, New Taipei (TW); Chang-Fa Lin, Hsinchu (TW); Ching-Hung Cheng, Miaoli (TW); Yi-Chuan Lo, Hsinchu (TW); Ming-Hsuan Chuang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 169 days.

(21) Appl. No.: 14/871,846

(22) Filed: Sep. 30, 2015

(65) Prior Publication Data

US 2017/0092497 A1    Mar. 30, 2017

(51) Int. Cl.
  *G03F 7/30*     (2006.01)
  *G03F 7/32*     (2006.01)
  *H01L 27/11582*  (2017.01)
  *H01L 49/02*    (2006.01)

(52) U.S. Cl.
  CPC ............... *G03F 7/30* (2013.01); *G03F 7/322* (2013.01); *H01L 27/11582* (2013.01); *H01L 28/00* (2013.01)

(58) Field of Classification Search
  CPC ............... G03F 7/30; G03F 7/322; G03F 7/32
  USPC ......................................... 430/434, 435, 436
  See application file for complete search history.

(56) References Cited

U.S. PATENT DOCUMENTS

| | | | |
|---|---|---|---|
| 5,445,193 A * | 8/1995 | Koeninger | B01F 5/0218 141/104 |
| 6,158,721 A | 12/2000 | Katou et al. | |
| 7,533,873 B2 | 5/2009 | Nagasaka et al. | |
| 8,727,323 B2 | 5/2014 | Seiwart et al. | |
| 9,057,959 B2 | 6/2015 | Hatakeyama et al. | |
| 2001/0031501 A1 * | 10/2001 | Nomura | G01N 27/06 436/149 |
| 2004/0241567 A1 * | 12/2004 | Teraoka | G03G 9/125 430/115 |
| 2006/0141399 A1 | 6/2006 | Chang et al. | |
| 2009/0035696 A1 * | 2/2009 | Matsuoka | C07C 43/15 430/281.1 |
| 2009/0246958 A1 * | 10/2009 | Burns | G03F 7/091 438/694 |
| 2010/0086880 A1 * | 4/2010 | Saito | G11B 7/261 430/325 |
| 2015/0042084 A1 * | 2/2015 | Staub | B42D 25/445 283/91 |

FOREIGN PATENT DOCUMENTS

| | | | |
|---|---|---|---|
| CN | 1503064 A | 6/2004 | |
| CN | 104102095 A | 10/2014 | |
| JP | 60-86828 A | 5/1985 | |
| JP | 9-162094 A | 6/1997 | |
| JP | 2001-228628 * | 8/2001 | ............... G03F 7/32 |
| JP | 2010225626 A | 10/2010 | |
| TW | 200940190 A | 10/2009 | |
| TW | 201504774 A | 2/2015 | |

* cited by examiner

*Primary Examiner* — Daborah Chacko-Davis
(74) *Attorney, Agent, or Firm* — Slater Matsil, LLP (57) ABSTRACT

A system for fabricating a semiconductor device includes a first supplier, a second supplier, a mixer, and an applier. The first supplier is configured to supply a developer solution having a first chemical. The second supplier is configured to supply the second chemical to the mixer. The mixer is configured to mix the developer solution with a second chemical, in which the second chemical is configured to form a plurality of bubbles in the developer solution. The applier is configured to apply the developer solution mixed with the bubbles onto a photoresist layer formed on a substrate, in which the photoresist layer has an exposed region, and the first chemical is configured to dissolve the exposed region of the photoresist layer through a chemical reaction.

20 Claims, 6 Drawing Sheets

METHOD AND SYSTEM FOR FABRICATING SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, lithography processes often implement exposing and developing processes to pattern small features during IC wafer fabrication and mask fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
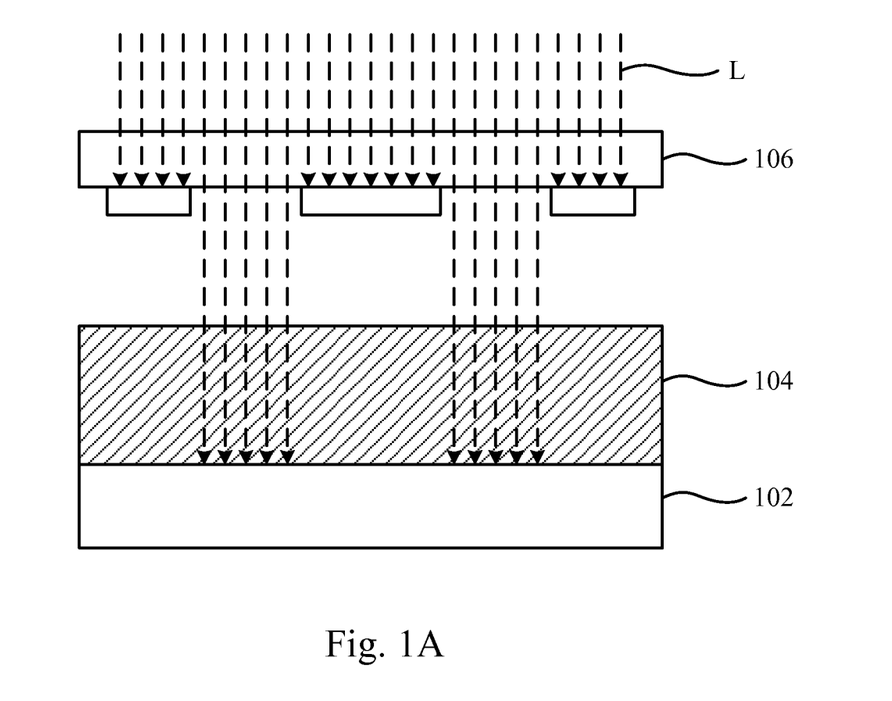
FIGS. 1A-1C are cross-sectional views sequentially illustrating fabricating steps of a semiconductor device according to some embodiments of the present disclosure.
Figure 1B:
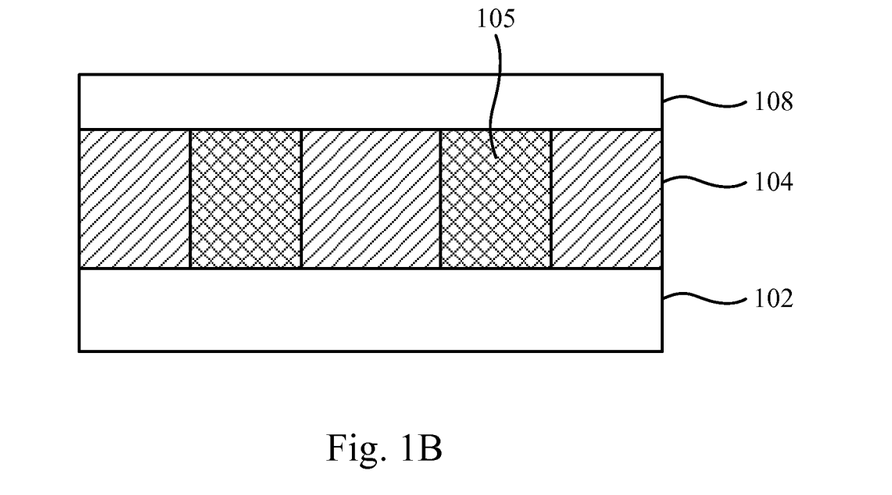
Figure 1C:
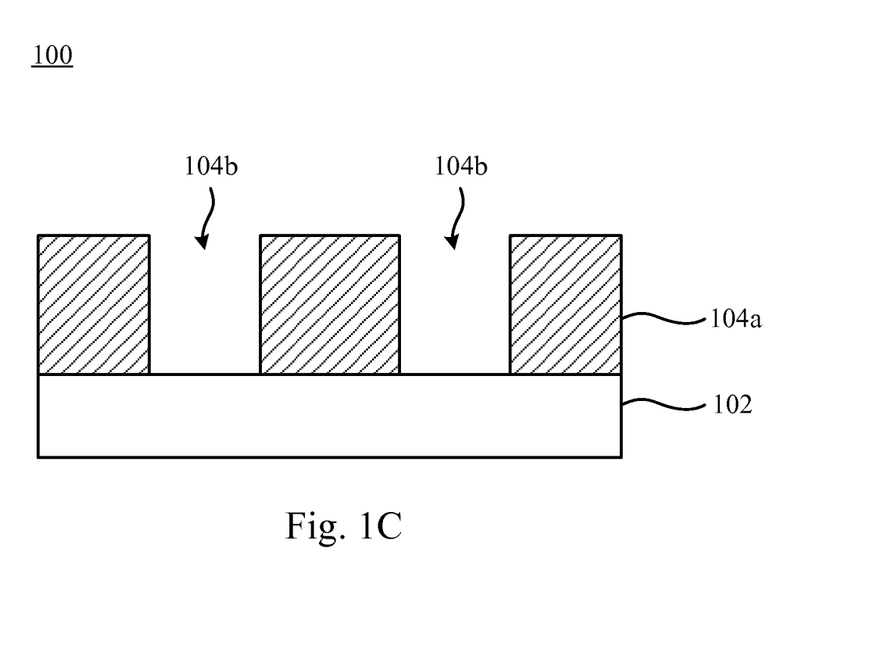

Reference is made to FIGS. 1A-1C. FIGS. 1A-1C are cross-sectional views sequentially illustrating fabricating steps of a semiconductor device 100 according to some embodiments of the present disclosure. The semiconductor device 100 (see FIG. 1C) includes a substrate 102 and a photoresist layer 104. The photoresist layer 104 is coated on the substrate 102 by a proper technique, such as spin-on coating. After the photoresist layer 104 is coated on the substrate 102, a soft baking process may be implemented to partially drive out the solvent in the photoresist layer 104. The substrate 102 may include a wafer and a plurality of conductive and non-conductive thin films formed on the wafer. The wafer may be a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including silicon-germanium (SiGe), gallium arsenide phosphide (GaAsP), aluminium indium arsenide (AlInAs), aluminium gallium arsenide (AlGaAs), gallium indium arsenide (GaInAs), gallium indium phosphide (GaInP), and/or gallium Indium arsenide phosphide (GaInAsP). In yet some alternative embodiments, the wafer has a semiconductor on insulator (SOI) structure. The plurality of conductive and non-conductive thin films may include a conductive or an insulator material. For example, the conductive material includes metal such as aluminum (Al), copper (Cu), tungsten (W), nickel (Ni), titanium (Ti), gold (Au), platinum (Pt), or alloys of the metals. The insulator material may include silicon oxide, silicon nitride, or combinations thereof. The substrate 102 may alternatively be a non-semiconductor material, such as a glass substrate for thin-film-transistor liquid crystal display (TFT-LCD) devices, or fused quartz or calcium fluoride for a photomask (mask or reticle). The substrate 102 may include one or more other material layers to be patterned, such as a poly-silicon layer, a conductive layer, a dielectric layer, or multiple layers of various materials.

As shown in FIG. 1A, the photoresist layer 104 is deposited over the substrate 102. The photoresist layer 104 may include a positive tone resist or a negative tone resist. The photoresist layer 104 may also include a single photoresist film or a multiple layer photoresist film. As shown in FIG. 1A, the photoresist layer 104 deposited on the substrate 102 is exposed by an optical exposing tool (e.g. a lithography apparatus) during an exposure process. Light L (i.e., a form of radiation) generated by the optical tool is projected on a mask 106. The light L may include I-line light, deep ultraviolet (DUV), extreme ultra violet (EUV) light, X-ray light, or combinations thereof. The mask 106 blocks some of the light L to transfer a pattern of an integrated circuit (IC)

design layout to the photoresist layer 104. The mask 106 includes a binary mask or a phase shift mask (PSM). The phase shift mask may be an alternative phase shift mask (alt. PSM) or an attenuated phase shift mask (att. PSM). In some embodiments, a mask is also referred to as a photomask or a reticle.

As shown in FIG. 1A, some of the light L is blocked by the mask 106, and some of the light L passes through the mask 106 and is projected on the photoresist layer 104, where it reacts with a photo sensitive chemical in the photoresist layer 104 to form a latent image. For example, the photo sensitive chemical is a photo acid generator (PAG) in a deep ultraviolet (DUV) resist. The PAG in the resist releases the acid under the radiation of the light L, and the acid promotes a chemical amplify reaction (CAR), for example, releasing a protection group from the resist in an exposed area during a post-exposure bake (PEB) process. Due to the release of the protection group from the resist, a polarity of the resist in the exposed areas changes from hydrophobic polarity to hydrophilic polarity and a latent pattern is also formed in the exposed photoresist layer.

As shown in FIG. 1B, a developer solution 108 is applied to the exposed regions 105 (i.e., hydrophilic portions) of the photoresist layer 104 deposited on the substrate 102 for developing into a patterned structure (see FIG. 1C). In the depicted embodiment, the final patterned structure depends on the developer tone. For example, if a developer solution 108 such as tetramethylammonium hydroxide (TMAH) is applied to the exposed regions 105 of the photoresist layer 104, the exposed regions 105 of the photoresist layer 104 are dissolved by the developer solution 108 during the developing process, and the unexposed (hydrophobic) portions of the photoresist layer 104 remain to form a patterned photoresist layer 104a, providing the final patterned structure shown in FIG. 1C.

As shown in FIG. 1C, a plurality of trenches 104b separates the segments of the patterned photoresist layer 104a. These trenches 104b are formed by the removal of the exposed regions 105 of the photoresist layer 104. An aspect ratio of the trenches 104b may be defined as a ratio of a depth D of the trench 104b to a lateral width W of the trench 104b. The depth D of the trench 104b may also be considered the thickness or vertical dimension of the photoresist layer 104, and the width W of the trench 104b may also be considered the horizontal dimension of the region of the photoresist layer 104 exposed to radiation.

Figure 2:
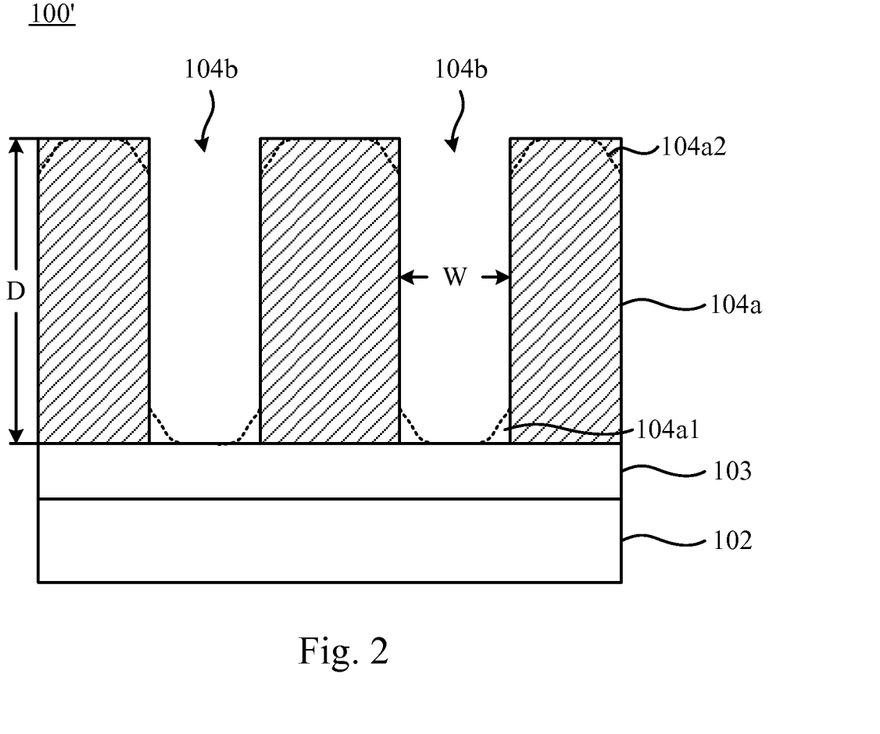
FIG. 2 is a cross-sectional view illustrating a semiconductor device according to some embodiments of the present disclosure.

Reference is made to FIG. 2. FIG. 2 is a cross-sectional view illustrating a semiconductor device 100' according to some embodiments of the present disclosure. A patterned photoresist layer 104a is formed over a patternable layer 103 disposed over a substrate 102. The patternable layer 103 may function as a hard mask layer for subsequent process, such as etch or ion implantation. As semiconductor fabrication technologies continue to advance (for example, moving to advanced nodes such as 14-nm or beyond), the fabrication process complexities will increase. More fabrication steps may be utilized in many cases. As a result, the patternable layer 103 underlying the photoresist layer 102 may need to be made thicker (i.e., having a greater vertical dimension than fabrication processes for previous generations). For example, a combined thickness of a hard mask layer and a polysilicon layer may only need to be as thick as 1000 Angstroms for a 28-nm process, but this combined thickness may need to be at least 2000 Angstroms for a 14-nm process. Thus, it may be said that advanced fabrication processes may involve using a patternable layer with a high or tall topography.

Due to the tall topography of the underlying patternable layer 103, the vertical dimension (i.e., the depth D) of the photoresist layer 104 may need to increase as well. This is because a thicker photoresist layer may be needed to pattern a correspondingly thicker underlying material layer. Meanwhile, semiconductor feature sizes remain the same or continue to shrink as fabrication technology continues its advance. Therefore, the width W (lateral dimension) of the trench 104b may remain the same or will actually shrink, even as its vertical dimension D continues to increase. This leads to an increasingly high aspect ratio of (the vertical dimension D) to (the horizontal dimension W).

Under the foregoing structural configuration, the photoresist layer 104 may have photoresist scums (also referred to as photoresist footing) at bottom of the trench 140b. That is, the patterned photoresist layer 104a includes straight up portions, and may include bottom footing portions 104a1 (as illustrated by dotted lines in FIG. 2) near the substrate 102. As shown in FIG. 2, the bottom footing portions 104a1 of the patterned photoresist layer 104a protrude laterally outwards, whereas the straight up portions of the patterned photoresist layer 104a can keep a relatively straight cross-ssectional profile. The laterally-protruding bottom footing portions 104a1 of the patterned photoresist layer 104a are undesirable since it adversely impacts lithography performance.

The existing of the bottom footing portions 104a1 of the patterned photoresist layer 104a is a consequence of the high aspect ratio of the trenches 104b. There may be several contributing factors. One factor is that the high aspect ratio of the trenches 104b makes it difficult for the developer solution 108 to come in and out of the trench 104b. Since the trenches 104b are deep, some of the developer solution 108 may get trapped near the bottom of the trenches 104b. The trapped developer solution 108 may prevent the bottom portions of the photoresist layer 104 from having chemical reactions with fresh developer solutions 108. The trapped developer solution 108 near the bottom of the trenches 104b also means that the portions of the photoresist material that have already gone through the chemical reaction will not easily be rinsed out of the trenches 104b, since they are effectively "blocked" by the trapped developer solution 108. In other words, the chemical reaction between the developer solution 108 and the photoresist material at the bottom of the trenches 104b becomes inefficient and ineffective as the aspect ratio of the trenches 104b becomes greater. This may lead to an incomplete reaction, thereby leaving the bottom footing portions 104a1 of the patterned photoresist layer 104a near the bottom of the trenches 104b.

Other contributing factors to the bottom footing portions 104a1 may include non-uniform exposure of the photoresist layer 104 during the exposing process. For example, during the exposing process, because of light scattering or light reflection, a bottom area of the photoresist layer 104 may be partially exposed by the scattering light or the reflective light. Thus, the partial exposed bottom area may not be dissolved during the developing process. And because of the light scattering and/or reflecting at the bottom of the photoresist layer 104, the photoresist layer 104 receives different energy doses at different portions, and therefore the photoresist layer 104 forms a latent resist profile with different polarity at upper and lower portions of the photoresist layer 104. The different polarity may have different solubility to the same developer solution, thereby also contributing to the bottom footing portions 104a1.

To prevent the bottom footing portions 104a1 from being formed at the bottom of the patterned photoresist layer 104a after removing the exposed regions 105, a method for fabricating a semiconductor device is provided according to some embodiments of the present disclosure.

Figure 3:
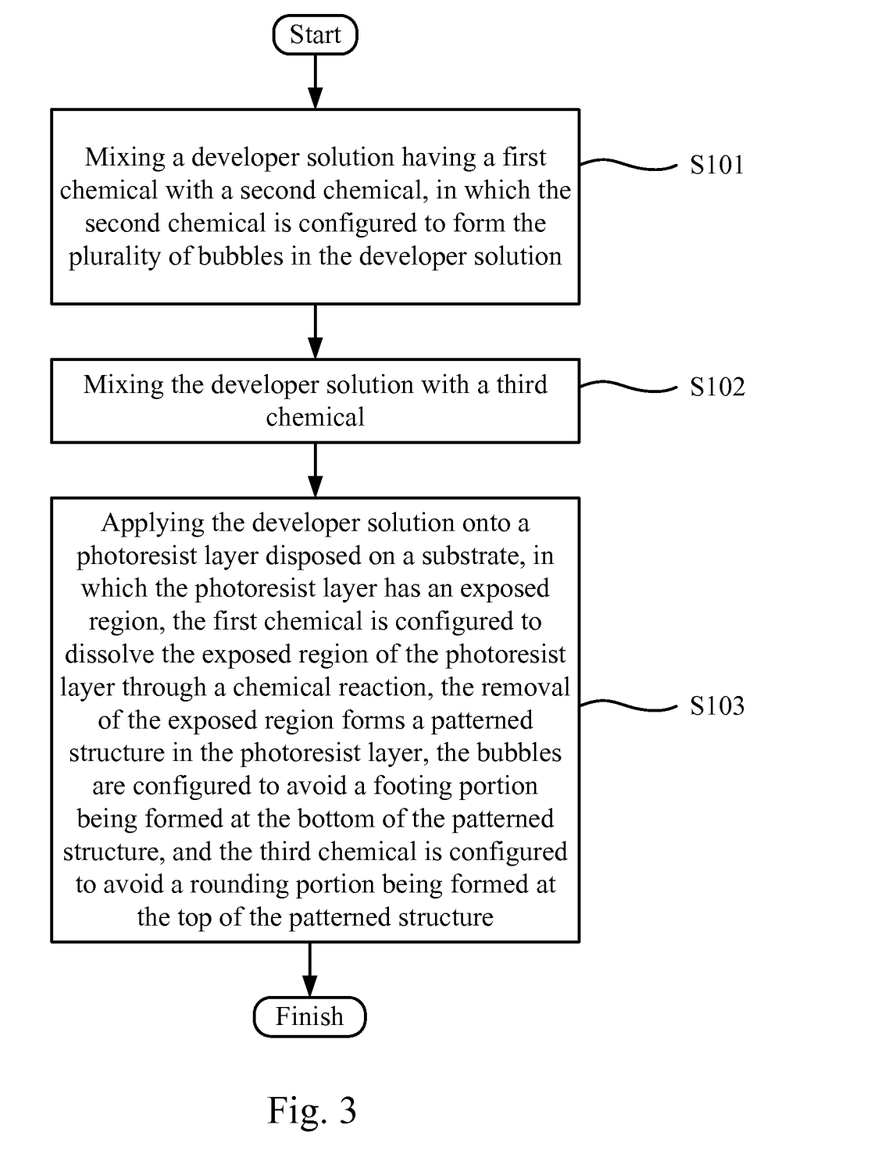
FIG. 3 is a flowchart of a method for fabricating a semiconductor device according to some embodiments of the present disclosure.

Reference is made to FIG. 3. FIG. 3 is a flowchart of a method for fabricating a semiconductor device according to some embodiments of the present disclosure. The method begins with block S101 in which a developer solution having a first chemical is mixed with a second chemical, and the second chemical is configured to form the plurality of bubbles in the developer solution. In some embodiments, the bubbles are micro bubbles. The method continues with block S102 in which the developer solution is mixed with a third chemical. The method continues with block S103 in which the developer solution is applied onto a photoresist layer disposed on a substrate, in which the photoresist layer has an exposed region, the first chemical is configured to dissolve the exposed region of the photoresist layer through a chemical reaction, the removal of the exposed region forms a patterned structure in the photoresist layer, the bubbles are configured to avoid a footing portion being formed at the bottom of the patterned structure, and the third chemical is configured to avoid a rounding portion being formed at the top of the patterned structure.

As shown in FIG. 2 and FIG. 3, it should be pointed out that even though the high aspect ratio of the trenches 104b makes it difficult for the developer solution 108 to come in and out of the trench 104b (because the trenches 104b are deep and some of the developer solution 108 may get trapped near the bottom of the trenches 104b), the plurality of bubbles formed in the developer solution 108 can prevent the developer solution 108 from being trapped near the bottom of the trenches 104b. As a result, the bubbles formed in the developer solution 108 may help the bottom portions of the photoresist layer 104 having chemical reactions with fresh developer solutions 108. The bubbles in the developer solution 108 near the bottom of the trenches 104b also means that the portions of the photoresist material that have already gone through the chemical reaction will continuously be rinsed out of the trenches 104b, since the bubbles can effectively prevent the developer solution 108 from being trapped near the bottom of the trenches 104b. In other words, the chemical reaction between the developer solution 108 and the photoresist material at the bottom of the trenches 104b becomes efficient and effective due to the bubbles formed in the developer solution 108. This can contribute to a complete reaction, thereby solving the problem that the bottom footing portions 104a1 are formed near the bottom of the trenches 104b of the patterned photoresist layer 104a.

In some embodiments, the second chemical is configured to produce the bubbles containing carbon dioxide. For example, the second chemical may include carbonate (e.g., calcium carbonate) and acid (e.g., hydrochloric acid), but the disclosure is not limited in this regard.

In addition, by mixing the developer solution 108 with a third chemical, the developer solution 108 can smoothly develop the exposed regions 105 of the photoresist layer 104, so as to effectively prevent rounding portions 104a2 (as illustrated by dotted lines in FIG. 2) from being formed at the top of the patterned structure (i.e., the bad profile near the top of the patterned photoresist layer 104a). In some embodiments, the third chemical includes water, but the disclosure is not limited in this regard. In some embodiments, the third chemical may include a solvent that has a low activity and does not have a chemical reaction with the first chemical.

In some embodiments, in order to smoothly develop the exposed regions 105 of the photoresist layer 104, the concentration of the first chemical in the developer solution 108 is controlled in a range from about 0.5 wt % to about 2.38 wt %, but the disclosure is not limited in this regard. In some embodiments, the concentration of the first chemical in the developer solution 108 can be detected by using an electric resistance meter, but the disclosure is not limited in this regard. In some embodiments, the first chemical in the developer solution 108 includes tetramethylammonium hydroxide (TMAH), but the disclosure is not limited in this regard.

In some embodiments, the developer solution, the second chemical, and the third chemical can be uniformly mixed by using a propeller, but the disclosure is not limited in this regard.

Figure 4:
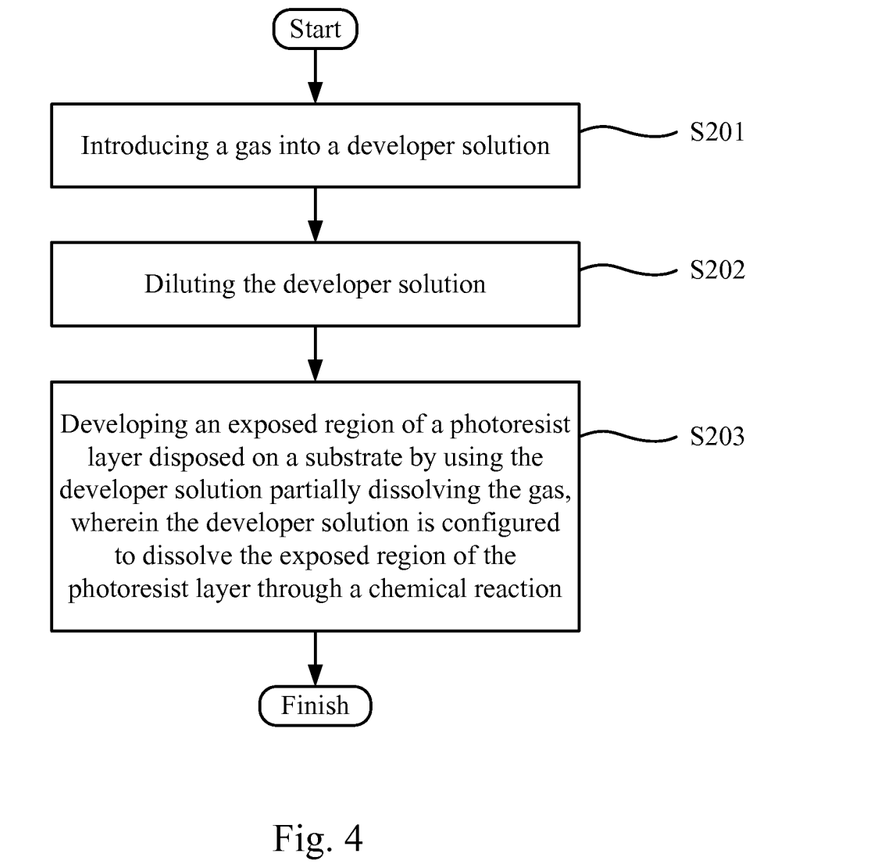
FIG. 4 is a flowchart of a method for fabricating a semiconductor device according to some other embodiments of the present disclosure.

Reference is made to FIG. 4. FIG. 4 is a flowchart of a method for fabricating a semiconductor device according to some other embodiments of the present disclosure. The method begins with block S201 in which a gas is introduced into a developer solution. The method continues with block S202 in which the developer solution is diluted. The method continues with block S203 in which an exposed region of a photoresist layer disposed on a substrate is developed by using the developer solution partially dissolving the gas, in which the developer solution is configured to dissolve the exposed region of the photoresist layer through a chemical reaction.

As shown in FIG. 2 and FIG. 4, it should be pointed out that even though the high aspect ratio of the trenches 104b makes it difficult for the developer solution 108 to come in and out of the trench 104b, the gas introduced into the developer solution 108 can prevent the developer solution 108 from being trapped near the bottom of the trenches 104b (because the gas can increase the fluidity of the developer solution 108). As a result, the gas introduced into the developer solution 108 may help the bottom portions of the photoresist layer 104 having chemical reactions with fresh developer solutions 108. The gas introduced into the developer solution 108 near the bottom of the trenches 104b also means that the portions of the photoresist material that have already gone through the chemical reaction will continuously be rinsed out of the trenches 104b, since the gas can effectively prevent the developer solution 108 from being trapped near the bottom of the trenches 104b. In other words, the chemical reaction between the developer solution 108 and the photoresist material at the bottom of the trenches 104b becomes efficient and effective due to the gas introduced into the developer solution 108. This can contribute to a complete reaction, thereby solving the problem that the bottom footing portions 104a1 (as illustrated by dotted lines in FIG. 2) are formed near the bottom of the trenches 104b of the patterned photoresist layer 104a.

In addition, by diluting the developer solution 108, the developer solution 108 can smoothly develop the exposed regions 105 of the photoresist layer 104, so as to effectively prevent rounding portions 104a2 (as illustrated by dotted lines in FIG. 2) from being formed at the top of the patterned structure (i.e., the bad profile near the top of the patterned photoresist layer 104a).

In some embodiments, the gas includes carbon dioxide, but the disclosure is not limited in this regard.

In some embodiments, the developer solution is diluted by using water, but the disclosure is not limited in this regard.

Figure 5:
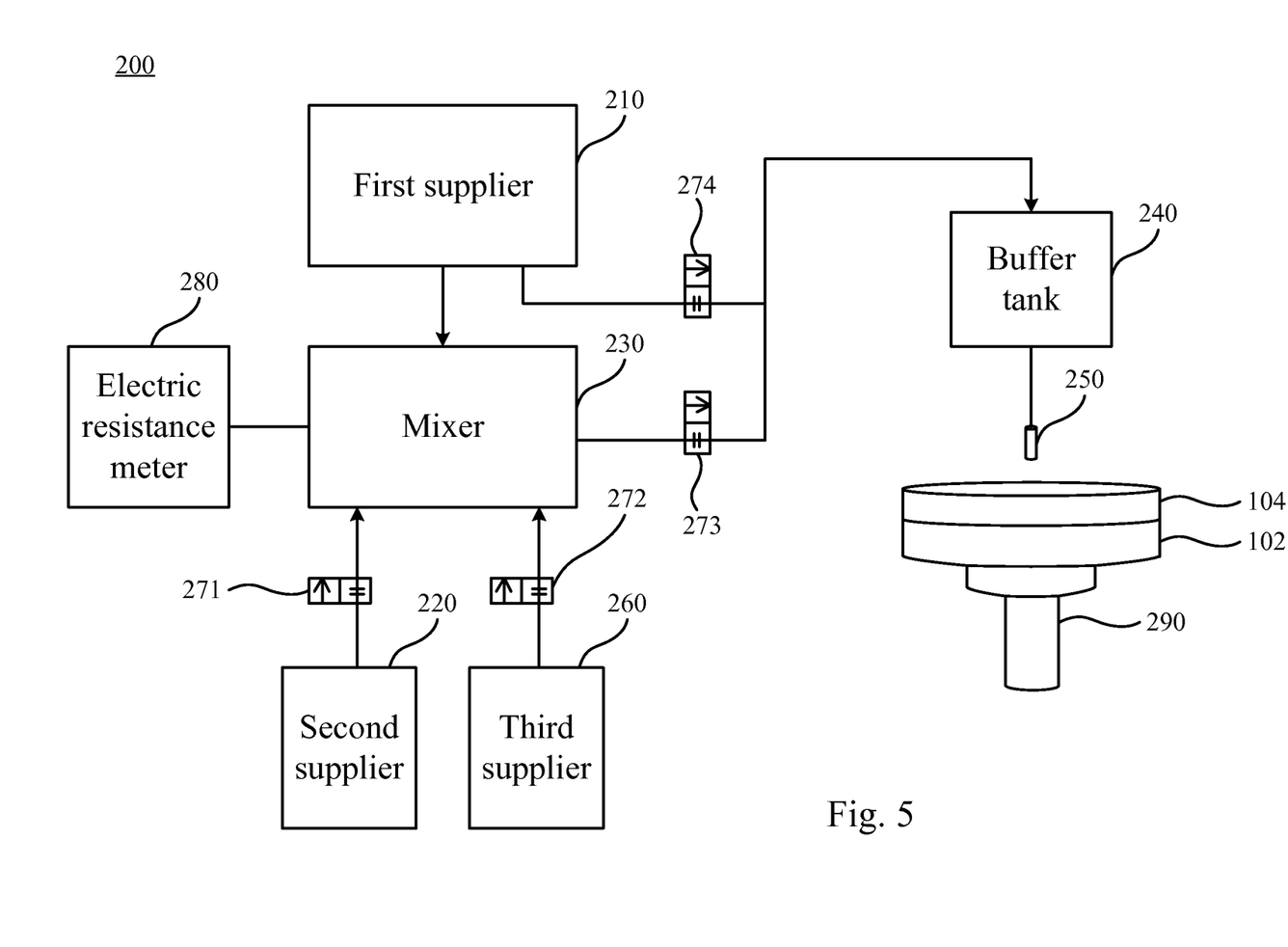
FIG. 5 is a schematic diagram illustrating a system for fabricating a semiconductor device according to some embodiments of the present disclosure.

Reference is made to FIG. 5. FIG. 5 is a schematic diagram illustrating a system 200 for fabricating a semiconductor device according to some embodiments of the present disclosure. As shown in FIG. 5, the system 200 for fabricating a semiconductor device includes a first supplier 210, a second supplier 220, a mixer 230, a buffer tank 240, an applier 250, and a chuck 290. The first supplier 210 is configured to supply a developer solution 108 (see FIG. 1B) having the first chemical. The second supplier 220 is configured to supply the second chemical to the mixer 230. The mixer 230 is configured to mix the developer solution 108 with a second chemical, in which the second chemical is configured to form a plurality of bubbles in the developer solution 108. The applier 250 is configured to apply the developer solution 108 mixed with the bubbles onto the photoresist layer 104 formed on the substrate 102, in which the photoresist layer 104 has the exposed regions 105 (see FIG. 1B), and the first chemical is configured to dissolve the exposed regions 105 of the photoresist layer 104 through a chemical reaction. In some embodiments, the applier 250 is a nozzle, but the disclosure is not limited in this regard. The chuck 290 is configured to secure the substrate 102 deposited with the photoresist layer 104 during the developing process.

In some embodiments, the system 200 further includes a first valve 271 connected between the mixer 230 and the second supplier 220. The first valve 271 is configured to control the flow rate of the second chemical supplied from the second supplier 220 to the mixer 230.

In some embodiments, the system 200 further includes a third supplier 260. The third supplier 260 is configured to supply a third chemical to the mixer 230, in which the third chemical is configured to dilute the developer solution 108. In some embodiments, the system 200 further includes a second valve 272 connected between the mixer 230 and the third supplier 260. The second valve 272 is configured to control the flow rate of the third chemical supplied from the third supplier 260 to the mixer 230.

In some embodiments, the buffer tank 240 is connected to the first supplier 210, the mixer 230, and the applier 250, in which the buffer tank 240 is configured to accommodate the developer solution 108 directly from the first supplier 210 and the developer solution 108 mixed with the bubbles and water from the mixer 230. In some embodiments, the system 200 further includes a third valve 273 and a fourth valve 274. The third valve 273 is connected between the mixer 230 and the buffer tank 240. The third valve 273 is configured to control the flow rate of the developer solution 108 mixed with the bubbles supplied from the mixer 230 to the buffer tank 240. The fourth valve 274 is connected between the first supplier 210 and the buffer tank 240. The fourth valve 274 is configured to control the flow rate of the developer solution 108 supplied from the first supplier 210 to the buffer tank 240.

In some embodiments, the system 200 further includes an electric resistance meter 280. The electric resistance meter 280 is configured to detect a concentration of the first chemical of the developer solution 108 in the mixer 230. In order to control the concentration of the first chemical of the developer solution 108 in the mixer 230, a user can control the first valve 271 to adjust the amounts of the second chemical flowing from the second supplier 220 to the mixer 230 and/or control the second valve 272 to adjust the amounts of the third chemical flowing from the third supplier 260 to the mixer 230.

In some other embodiments of the present disclosure, the electric resistance meter 280 can be connected to the buffer tank 240 and configured to detect the concentration of the first chemical of the developer solution 108 in the buffer tank 240. In order to control the concentration of the first chemical of the developer solution 108 in the buffer tank 240, a user can control the third valve 273 to adjust the amounts of the diluted developer solution 108 with the bubbles flowing from the mixer 230 to the buffer tank 240 and/or control the fourth valve 274 to adjust the amounts of the developer solution 108 flowing from the first supplier 210 to the mixer 230.

Figure 6:
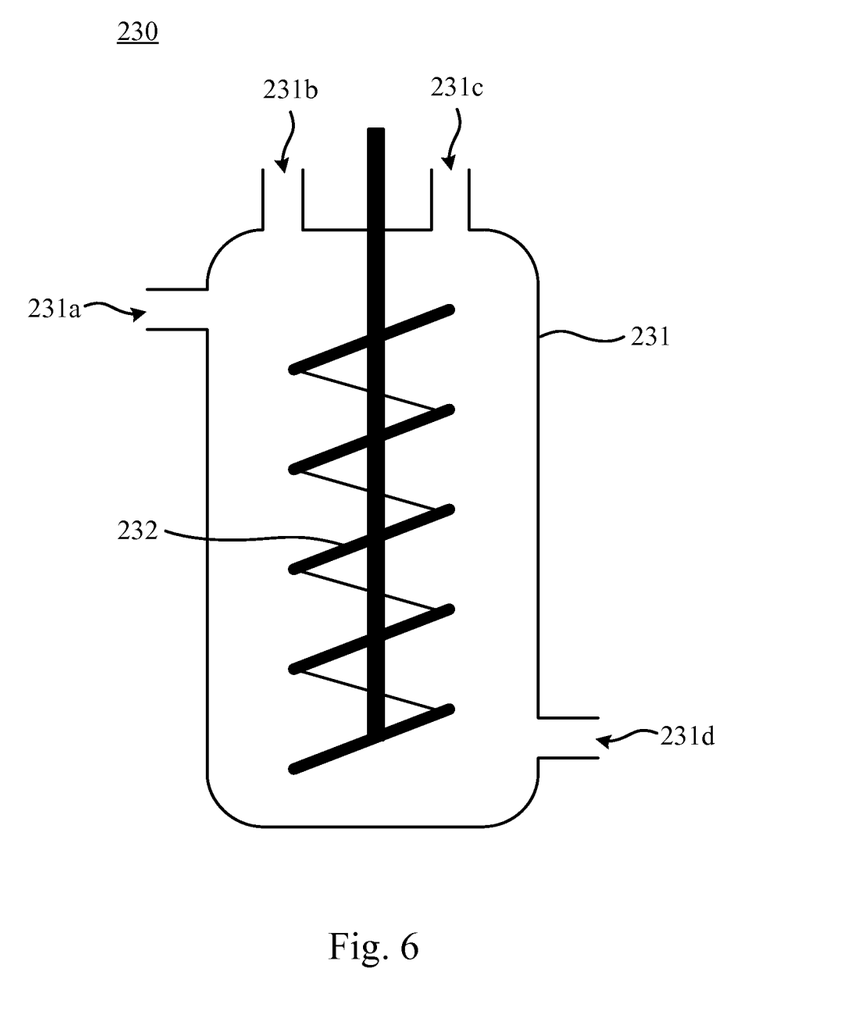
FIG. 6 is a schematic diagram illustrating the mixer of FIG. 5 according to some other embodiments of the present disclosure.

Reference is made to FIG. 6. FIG. 6 is a schematic diagram illustrating the mixer 230 of FIG. 5 according to some other embodiments of the present disclosure.

As shown in FIG. 6, it can be seen that the mixer 230 includes a housing 231 and a propeller 232. The housing 231 of the mixer 230 is configured to accommodating the developer solution 108 supplied from the first supplier 210, the second chemical supplied from the second supplier 220, and the third chemical supplied from the third supplier 260. In detail, the housing 231 of the mixer 230 has a first inlet 231a, a second inlet 231b, and a third inlet 231c. The first inlet 231a, the second inlet 231b, and the third inlet 231c are respectively connected to the first supplier 210, the second supplier 220, and the third supplier 260. The propeller 232 is rotatably disposed in the housing 231 and is configured to stir the developer solution 108 with the second chemical to form the bubbles and/or with the third chemical to dilute the developer solution 108.

According to the foregoing recitations of the embodiments of the disclosure, it can be seen that by mixing the developer solution with the second chemical to form a plurality of bubbles in the developer solution, the developer solution having the bubbles can prevent the developer solution from being trapped near the bottom of the trenches of the patterned photoresist layer, so that the chemical reaction between the developer solution and the photoresist material at the bottom of the trenches becomes efficient and effective due to the bubbles formed in the developer solution, thereby solving the problem that the bottom footing portions are formed near the bottom of the trenches of the patterned photoresist layer. In addition, by mixing the developer solution with a third chemical, the developer solution can smoothly develop the exposed regions of the photoresist layer, so as to effectively prevent rounding portions from being formed at the top of the patterned structure, thereby obtaining an ideal profile near the top of the patterned photoresist layer.

According to some embodiments, a method for fabricating a semiconductor device is provided. The method includes: forming a plurality of bubbles in a developer solution having a first chemical; and applying the developer solution onto a photoresist layer disposed on a substrate, wherein the photoresist layer has an exposed region, and the first chemical is configured to dissolve the exposed region of the photoresist layer through a chemical reaction.

According to some embodiments, a method for fabricating a semiconductor device is provided. The method includes: introducing a gas into a developer solution; and developing an exposed region of a photoresist layer disposed on a substrate by using the developer solution partially dissolving the gas, wherein the first chemical is configured to dissolve the exposed region of the photoresist layer through a chemical reaction.

According to some embodiments, a system for fabricating a semiconductor device is provided. The system includes a first supplier, a second supplier, a mixer, and an applier. The first supplier is configured to supply a developer solution having a first chemical. The second supplier is configured to supply the second chemical to the mixer. The mixer is configured to mix the developer solution with a second chemical, in which the second chemical is configured to form a plurality of bubbles in the developer solution. The applier is configured to apply the developer solution mixed with the bubbles onto a photoresist layer formed on a substrate, in which the photoresist layer has an exposed region, and the first chemical is configured to dissolve the exposed region of the photoresist layer through a chemical reaction.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    before applying a developer solution onto a photoresist layer disposed on a substrate, forming a plurality of bubbles in the developer solution having a first chemical, the forming of the plurality of bubbles in the developer solution comprising:
        introducing a second chemical into a mixer;
        introducing a third chemical into a mixer;
        mixing the second chemical and the third chemical to form a first mixture, the first mixture comprising the plurality of bubbles and a first solution, the first mixture having a first concentration of the first chemical;
        introducing an additional amount of the second chemical or the third chemical into the mixer to form a second mixture, the second mixture comprising the plurality of bubbles and a second solution;
        introducing the second mixture into a buffer tank;
        after introducing the second mixture into the buffer tank, detecting a second concentration of the first chemical in the buffer tank;
        based on the second concentration, introducing an additional amount of the first chemical from a supplier to the buffer tank to form the developer solution, the developer solution comprising the first chemical and the plurality of bubbles; and
    applying the developer solution onto the photoresist layer disposed on the substrate, wherein the photoresist layer comprises a photo acid generator, and wherein the photoresist layer has an exposed region, and the first chemical is configured to dissolve the exposed region of the photoresist layer through a chemical reaction.

2. The method of claim 1, wherein the forming the plurality of bubbles comprises:
    mixing the developer solution with the second chemical configured to form the plurality of bubbles in the developer solution.

3. The method of claim 2, wherein the mixing comprising:
    mixing the developer solution with the second chemical by using a propeller.

4. The method of claim 2, wherein the second chemical is configured to produce the bubbles containing carbon dioxide.

5. The method of claim 1, wherein the dissolving of the exposed region forms a patterned structure in the photoresist layer, and the bubbles are configured to avoid a footing portion being formed at the bottom of the patterned structure.

6. The method of claim 5, wherein the forming the plurality of bubbles comprises:
    mixing the developer solution with the third chemical configured to avoid a rounding portion being formed at the top of the patterned structure.

7. The method of claim 6, wherein the third chemical comprises water.

8. The method of claim 1, further comprising:
    controlling a third concentration of the first chemical in the buffer tank in a range from about 0.5 wt % to about 2.38 wt %.

9. The method of claim 1, wherein the
    detecting the second concentration of the first chemical comprises using an electric resistance meter.

10. The method of claim 1, wherein the first chemical comprises tetramethylammonium hydroxide (TMAH).

11. A method for fabricating a semiconductor device, comprising:
    mixing a gas of a first chemical into a second chemical to form a first developer solution in a mixer, the mixing forming a plurality of bubbles in the first developer solution;
    detecting a first concentration of a third chemical in the first developer solution in the mixer;
    providing a second developer solution in a supplier, the second developer solution comprising the third chemical;
    introducing the first developer solution into a buffer tank;
    introducing the second developer solution into the buffer tank with the first developer solution to form a third developer solution;
    detecting a second concentration of the third chemical in the third developer solution;
    based on the second concentration, introducing more of the second developer solution into the buffer tank to form a fourth developer solution; and
    developing an exposed region of a photoresist layer disposed on a substrate by using the fourth developer solution partially dissolving the gas, wherein an acid has been released from the photoresist layer in the exposed region prior to the developing the exposed region, and wherein the fourth developer solution is configured to dissolve the exposed region of the photoresist layer through a chemical reaction.

12. The method of claim 11, wherein the gas comprises carbon dioxide.

13. The method of claim 11, further comprising:
    diluting the first developer solution by using water.

14. A method for fabricating a semiconductor device, the method comprising:

supplying a developer solution to a mixer, wherein the developer solution comprises a first chemical;

supplying a second chemical to the mixer, wherein the second chemical comprises calcium carbonate and hydrochloric acid;

supplying a third chemical to the mixer, wherein the third chemical is non-reactive with the first chemical;

before applying the developer solution onto a photoresist layer formed on a substrate, mixing the developer solution with the second chemical in the mixer, the second chemical forming a plurality of bubbles in the developer solution;

detecting a first concentration of the first chemical in the mixer;

based on the first concentration, supplying an additional amount of the third chemical to the mixer to form a first mixture;

introducing the first mixture to a buffer tank;

detecting a second concentration of the first chemical in the buffer tank;

based on the second concentration, supplying an additional amount of the developer solution to the buffer tank;

from the buffer tank, applying the developer solution with the plurality of bubbles onto the photoresist layer formed on the substrate; and dissolving an exposed region of the photoresist layer through a chemical reaction between the exposed region and the first chemical.

15. The method of claim 14, further comprising:
diluting the developer solution with the third chemical.

16. The method of claim 15, wherein the third chemical comprises water and the plurality of bubbles comprise bubbles of carbon dioxide.

17. The method of claim 14, wherein the
detecting the first concentration of the first chemical in the mixer comprises using an electric resistance meter.

18. The method of claim 14, further comprising:
storing the developer solution with the plurality of bubbles in the buffer tank.

19. The method of claim 14, further comprising:
controlling a third concentration of the first chemical in the buffer tank in a range from about 0.5 wt % to about 2.38 wt %.

20. The method of claim 14, wherein the first chemical comprises tetramethylammonium hydroxide (TMAH).

* * * * *